(12) United States Patent
Hosoya (10) Patent No.: US 9,374,911 B2
(45) Date of Patent: Jun. 21, 2016

(54) FLEXIBLE PRINTED CIRCUIT

(71) Applicant: LENOVO (SINGAPORE) PTE, LTD, New Tech Park (SG)

(72) Inventor: Satoshi Hosoya, Kanagawa-Ken (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 654 days.

(21) Appl. No.: 13/745,296

(22) Filed: Jan. 18, 2013

(65) Prior Publication Data

US 2014/0204517 A1    Jul. 24, 2014

(51) Int. Cl.
*H05K 1/00* (2006.01)
*H05K 3/36* (2006.01)
*H05K 1/02* (2006.01)
*H05K 1/14* (2006.01)
*H05K 3/28* (2006.01)
*H04M 1/02* (2006.01)

(52) U.S. Cl.
CPC ............. *H05K 3/361* (2013.01); *H04M 1/0277* (2013.01); *H05K 1/02* (2013.01); *H04M 1/0216* (2013.01); *H05K 1/147* (2013.01); *H05K 3/281* (2013.01); *H05K 2201/09063* (2013.01); *Y10T 29/49155* (2015.01)

(58) Field of Classification Search
CPC .. H01L 23/4985; H01L 25/162; H05K 1/028; H05K 1/147; H05K 1/0393; H05K 2203/302; H05K 3/4691; H05K 1/189; H05K 1/118
See application file for complete search history.

(56) References Cited

U.S. PATENT DOCUMENTS 4,484,039 A * 11/1984 Salie .................... H01H 13/702 200/292
2007/0089900 A1* 4/2007 Mitamura .............. H05K 1/028 174/254

* cited by examiner

*Primary Examiner* — Robert J Hoffberg
*Assistant Examiner* — Hung Dang
(74) *Attorney, Agent, or Firm* — Shimokaji IP (57) ABSTRACT

A flexible printed circuit (FPC) is provided comprising a base plate and a pair of elongated resin strips disposed on the base plate. The resin strips comprise conductive traces embedded between the resin strips and configured to electrically couple a first unit of an electronic device at a tail end of the resin strips with a second unit of the electronic device at an opposing end of the resin strips. The resin strips have edges having cutouts formed therein adjacent to the tail end.

20 Claims, 11 Drawing Sheets

FLEXIBLE PRINTED CIRCUIT

BACKGROUND OF THE INVENTION

The present invention relates generally to a flexible printed circuit (FPC) that connects one unit of a device to another unit of the device and, more specifically, to an FPC that inhibits the migration of water along the FPC.

Figure 1:
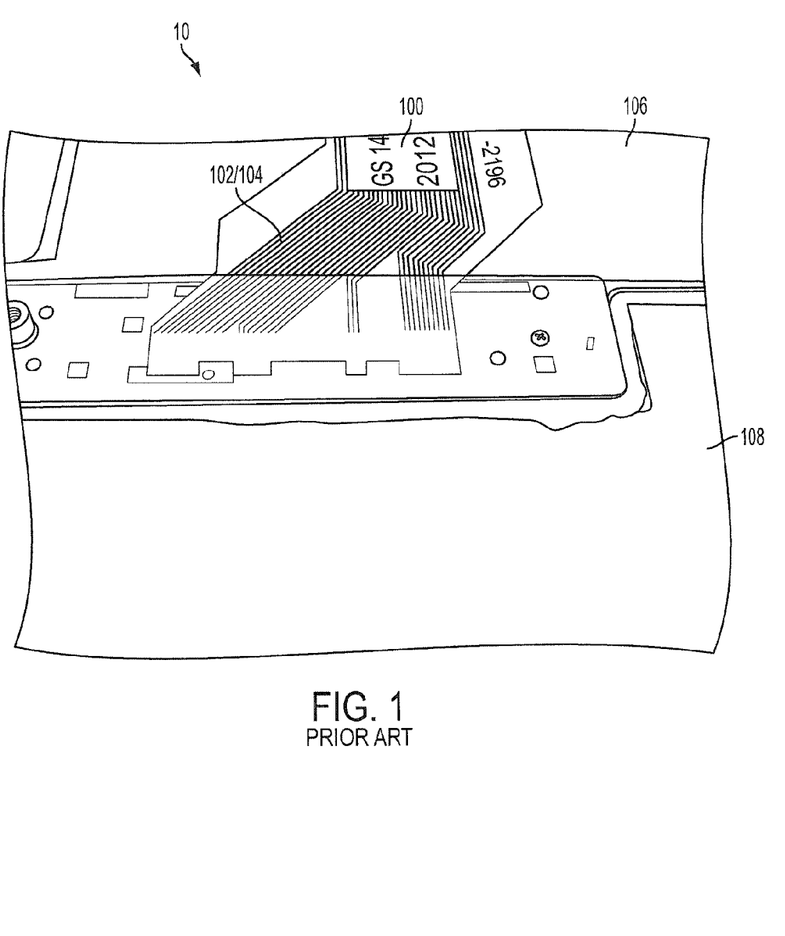
FIG. 1 is a perspective view of a tail exit of prior art FPC on which a water-tight film has been attached.
Figure 2A:
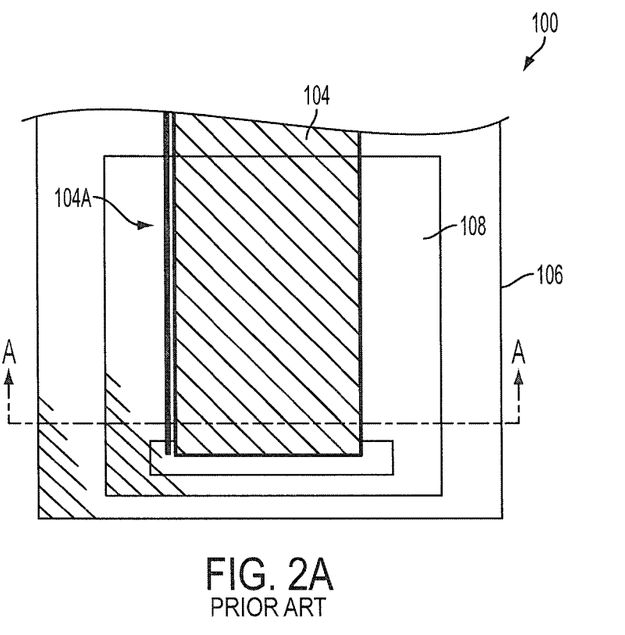
FIG. 2A is a top view of a prior art FPC.
Figure 2B:
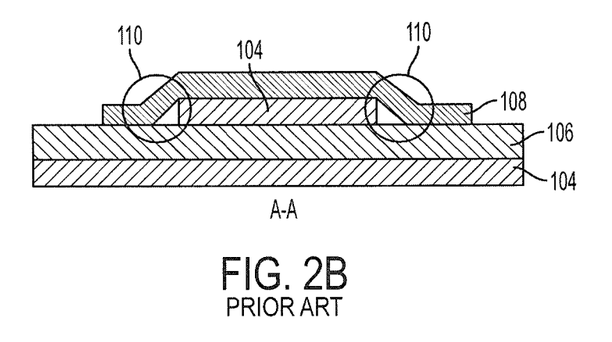
FIG. 2B is an end cut-away view taken along line A-A of FIG. 2A.

Some electronic devices, such as portable computers and flip-type cell phones, are manufactured as two units, which are mechanically connected to each other with a hinge. In order for power and signals to be exchanged between the two units, an FPC may be used to electrically couple the two units. FIG. 1 is a top perspective view of one end of an FPC 100 connected to, for example, a keyboard case 10. As illustrated in FIG. 2A, the FPC 100 may include conductive traces 102 embedded between a pair of resin strips 104 and is bonded to a base plate 106 of the keyboard case 10. To reduce the possibility of water or other liquid from a spill migrating into the unit 10 to which the FPC 100 is connected, the tail exit of the FPC 100 may be covered with a water-tight film 108, such as Mylar®. However, as illustrated in the cross-sectional view of FIG. 2B, there may be gaps 110 at the edge of the water-tight film 108 that can create channels along the edges of the strips 104, increasing the possibility of intrusion of liquid into the gaps 110 and into the unit 10. The resin strips 104, and therefore the gaps 110, may be about 0.25 millimeters (mm) thick.

Therefore, it can be seen that there is a need for a more effective method of reducing liquid migration from the tail exit of an FPC into connected devices.

SUMMARY

In one aspect, a flexible printed circuit (FPC) connection structure is provided. The FPC comprises a base plate and a pair of resin strips disposed on the base plate. The resin strips comprise conductive traces embedded between the FPC and configured to electrically couple a first unit of an electronic device at a tail end of the FPC with a second unit of the electronic device at an opposing end of the FPC; and edges having cutouts formed therein adjacent to the tail end.

In another aspect, a method of manufacturing a flexible printed circuit (FPC) is provided. The method comprises providing a pair of resin strips having a tail end; embedding conductive traces between the resin strips configured to electrically couple a first unit of an electronic device at the tail end of the resin strips with a second unit of the electronic device at an opposing end of the resin strips; forming cutouts in edges of the resin strips adjacent to the tail end configured to increase the effective length of the edges; bonding the resin strips to a baseplate; and overlaying a water-tight film on the resin strips at the tail end.

In a further aspect, an electronic device is provided. The electronic device comprises a first unit, a second unit pivotally connected to the first unit, and a flexible printed circuit (FPC) disposed to electrically couple the first unit with the second unit. The FPC comprises a base plate and a pair of resin strips between which conductive traces are embedded and extend the length of the FPC. The conductive traces are configured to electrically couple the first unit at a tail end of the FPC with the second unit at an opposing end of the resin strips, the resin strips having edges. The edges of the resin strips adjacent to the tail end have cutouts formed therein configured to increase the effective length of the edges. The FPC further comprises a water-tight film overlaying the resin strips at the tail end.

These and other features, aspects and advantages of the present invention will become better understood with reference to the following drawings, description and claims.

DETAILED DESCRIPTION OF EMBODIMENTS

The following detailed description is of the best currently contemplated modes of carrying out exemplary embodiments. The description is not to be taken in a limiting sense, but is made merely for the purpose of illustrating the general principles, since the scope of the embodiments is best defined by the appended claims.

Various inventive features are described below that can each be used independently of one another or in combination with other features.

Broadly, exemplary embodiments provide a flexible printed circuit (FPC) that electrically couples one unit of a device to another unit of the device. More specifically, exemplary embodiments provide an FPC that may inhibit the migration of water or other liquid in the FPC.

Figure 3:
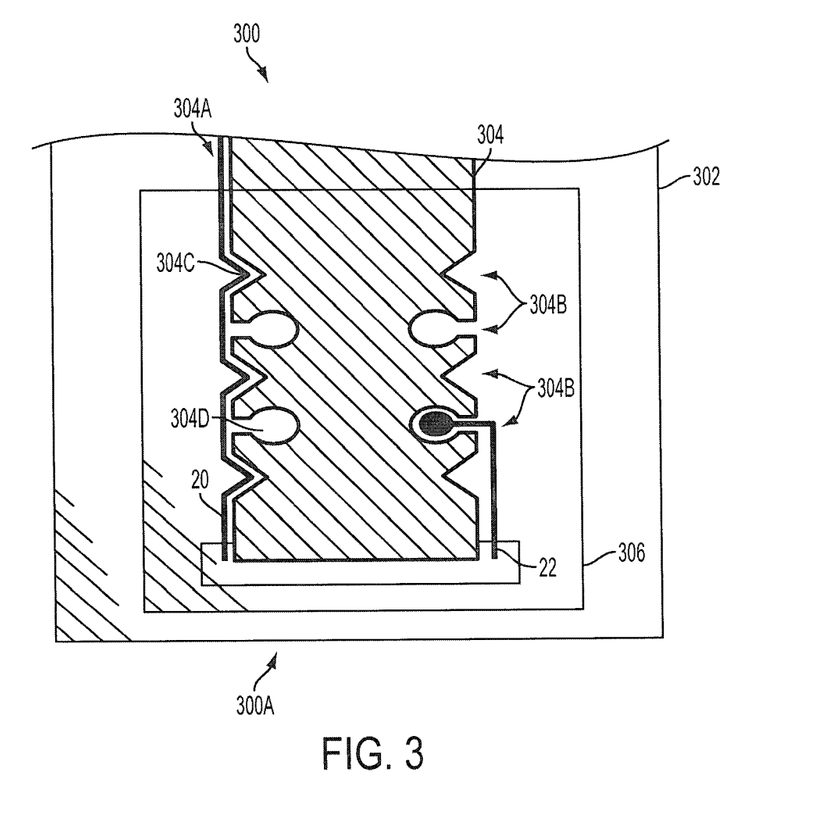
FIG. 3 is a top cutaway view of an FPC of the present invention illustrating an embodiment of the edges of the resin strips at the tail end of the FPC.

Referring to FIG. 3, according to exemplary embodiments, an FPC 300 may include a base plate 302 and pair of resin strips 304 between which conductive traces are embedded and extend the length of the resin strips 304. The conductive traces may electrically couple a first unit of an electrical device at a tail end of the FPC with a second unit of the electrical device at the opposite end of the FPC. The conductive traces may include a variety of types of thin and flexible interconnection circuits, such as an etched cupper conductive pattern sandwiched by a pair of polyimide resin strips, or a silk screen printed conductive pattern sandwiched by a pair of polyethylene terephthalate (PET) resin strips. A water-tight film 306 such as Mylar® or other sealing material may overlay the resin strips 304 to seal the edges 304A of the resin strips 304. Nonetheless, gaps or channels between the water-tight film 306 and the resin strips 304 may remain.

Figure 11:
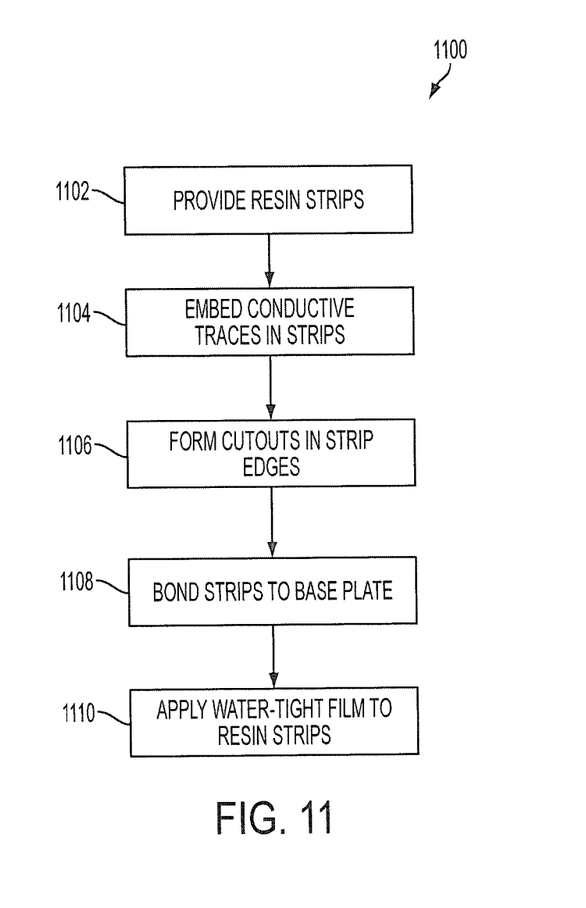
FIG. 11 is a flow chart of a method of producing an FPC of the present invention.

Referring also to the flow chart 1100 of FIG. 11, in contrast to the straight edges 104A of the prior art resin strips 104, according to one embodiment, the resin strips 304 may be provided (step 1102) and conductive traces may be embedded between the resin strips 304 (step 1104). Small cutouts 304B may be formed in their edges 304A near the tail exit 300A of the FPC 300 (step 1106) and the resin strips 304 may be bonded to the base plate 302 (step 1108). The cutouts 304B may increase the effective length of the edges 304A of the resin strips 304. Consequently, the path a liquid 20 must take through the channels between the resin strips edges 304A and the water-tight film 306 is lengthened and the time it takes for the liquid 20 to travel along the edges 304A may be increased. A water-tight film may overlaid on the resin strips 304 to provide an initial sealing barrier to liquid (step 1110).

According to one embodiment, the cutouts 304B in the edges 304A of the resin strip may be formed as notches, such as V-shaped notches 304C. According to another embodiment, the cutouts 304B in the edges 304A of the resin strips may be formed as oblong chambers 304D with narrow openings. When a liquid 22 enters the gaps, it may travel along the edges 304A and fill the chambers 304D. The pressure of the liquid 22 within the chambers 304D may then retard further liquid 22 flow along the edges 304A.

According to still another embodiment, the resin strips 304 may have both notches 304C and chambers 304D formed in an alternating pattern in the edges 304A near the tail exit 300A of the FPC 300. In this configuration, the effects on the flow of liquid by the notches 304C and by the chambers 304D may reinforce each other.

In one demonstration, a prior art FPC 100 having resin strips 104 with straight edges 104A was connected to a keyboard. The length of time it took for water to enter the gaps 110 and travel along the edge channels to reach the keyboard was about five minutes. In contrast, the length of time it took for water to reach the keyboard increased to about twenty minutes when the resin strips 304 with alternating notches 304C and chambers 304D were used. Any water that remains in the channels after water is removed from the outside of the FPC may eventually evaporate and not cause damage.

Figure 4:
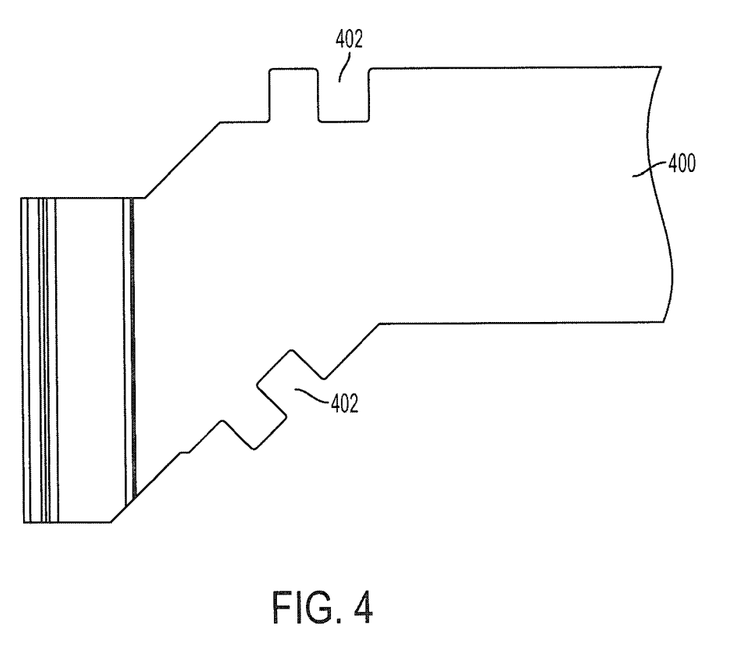
FIG. 4 is a top view of an alternative embodiment of the edges at the tail end of the FPC.

FIGS. 4-8 illustrate some edge configurations that may be used with the FPC 300. It will be appreciated that the illustrated edge configurations are representative and not exhaustive and that other configurations may be used. FIG. 4 illustrates a resin strip tail 400 with a single squared notch 402 cut into each edge. The notches 402 may be about 6 millimeters (mm) wide and about 6 mm deep.

Figure 5:
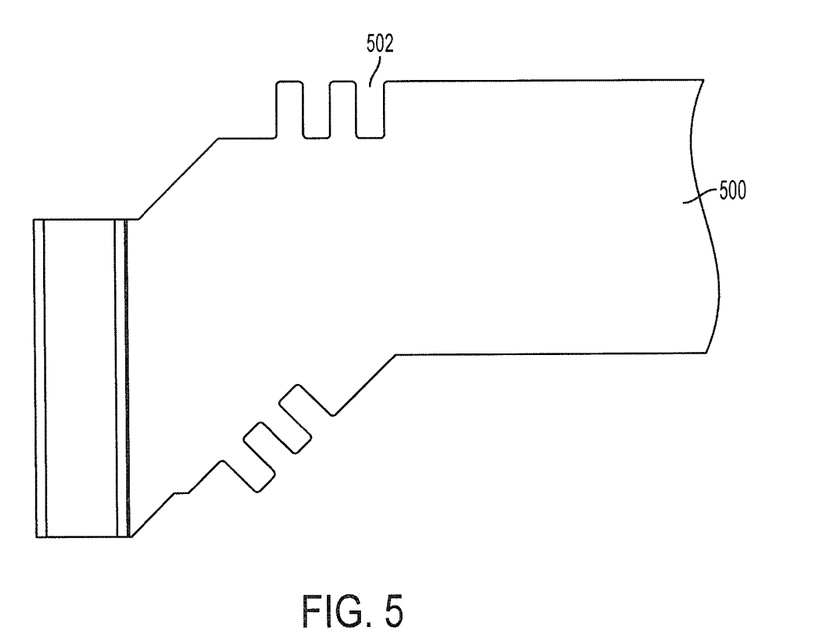
FIG. 5 is a top view of a second alternative embodiment of the edges at the tail end of the FPC.

FIG. 5 illustrates a resin strip tail 500 with multiple squared notches 502 cut into each edge. The notches 502 may be about 3 mm wide, about 6 mm deep, and spaced about 3 mm apart along each edge.

Figure 6:
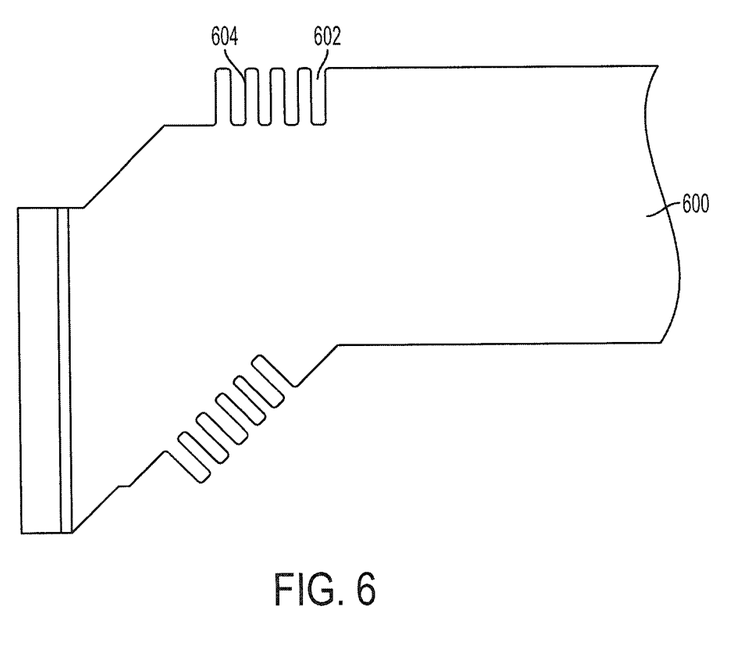
FIG. 6 is a top view of a third alternative embodiment of the edges at the tail end of the FPC.

FIG. 6 illustrates a resin strip tail 600 with a set of squared notches 602 cut into each edge. Each notch 602 may have rough sides 604. The notches 602 may be about 1.5 mm wide, about 6 mm deep, and spaced about 1.5 mm apart along each edge.

Figure 7:
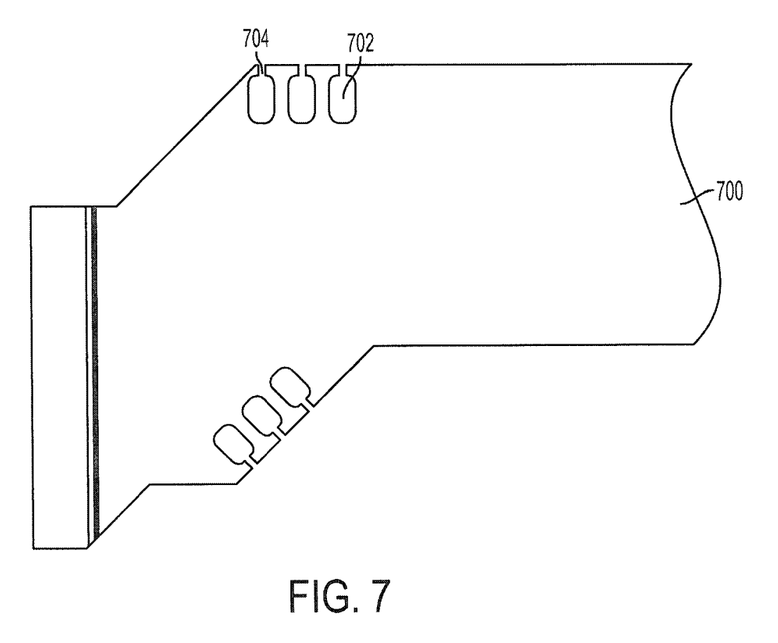
FIG. 7 is a top view of a fourth alternative embodiment of the edges at the tail end of the FPC.

FIG. 7 illustrates a resin strip tail 700 with a set of oblong chambers 702 cut into each edge. Each chamber 702 may have a narrow opening 704. The chambers 702 may be about 3 mm wide and about 5 mm deep. The openings 704 may be spaced about 5 mm apart along each edge.

Figure 8:
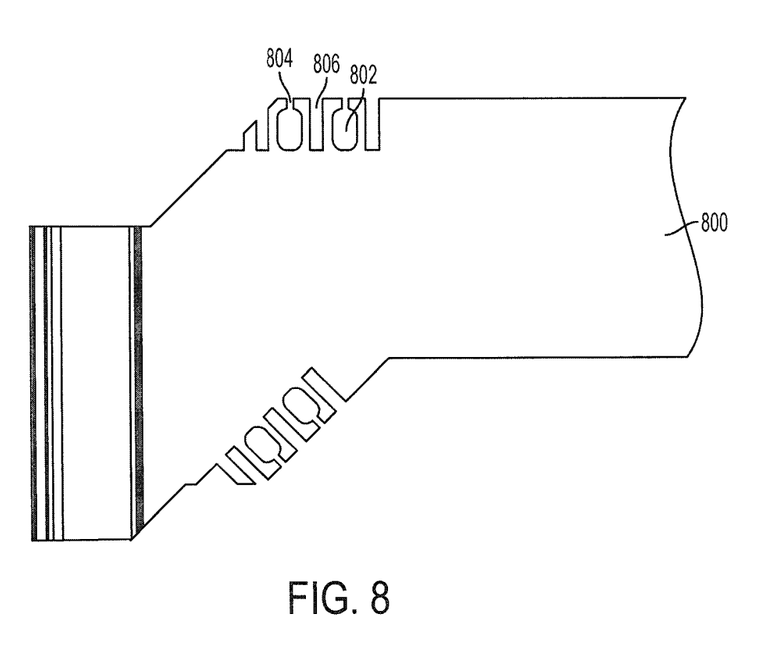
FIG. 8 is a top view of a fifth alternative embodiment of the edges at the tail end of the FPC.

FIG. 8 illustrates a resin strip tail 800 with a set of oblong chambers 802 cut into each edge. Each chamber 802 may have a narrow opening 804 and be separated from the adjacent chamber by a notch 806. The chambers 802 may be about 3 mm wide and about 5 mm deep and the notches may be about 1.5 mm wide and about 6 mm deep. The openings 804 may be spaced about 5 mm apart along each edge.

Figure 9:
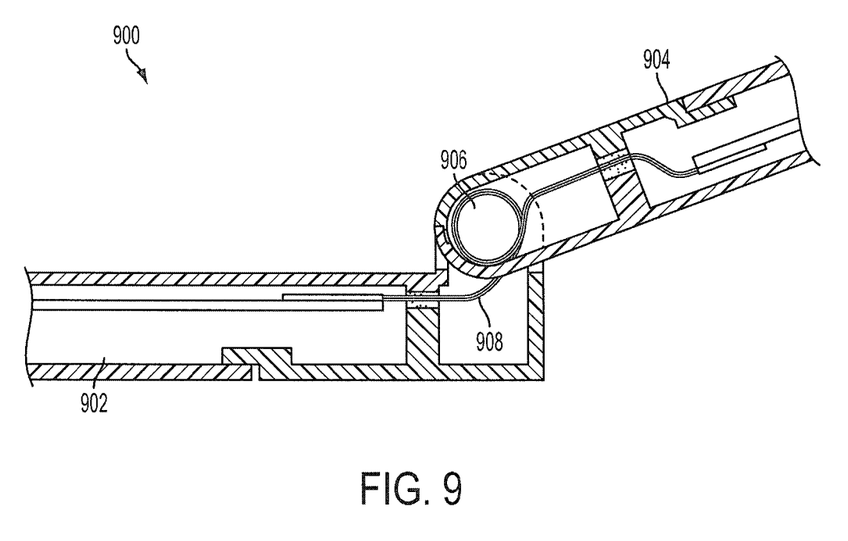
FIG. 9 is a side cross-sectional view of a notebook computer in which an embodiment of an FPC of the present invention is installed.

FIG. 9 is a side cross-sectional view of a notebook computer 900. A keyboard unit 902 may be mechanically connected to a display unit 904 with a hinge 906 to enable the two units 904, 906 to pivot relative to each other. The two units 904, 906 may be electrically coupled to each other with an embodiment of an FPC 908 of the present invention to inhibit the migration of water or other liquid along the edges of the resin strips.

Figure 10:
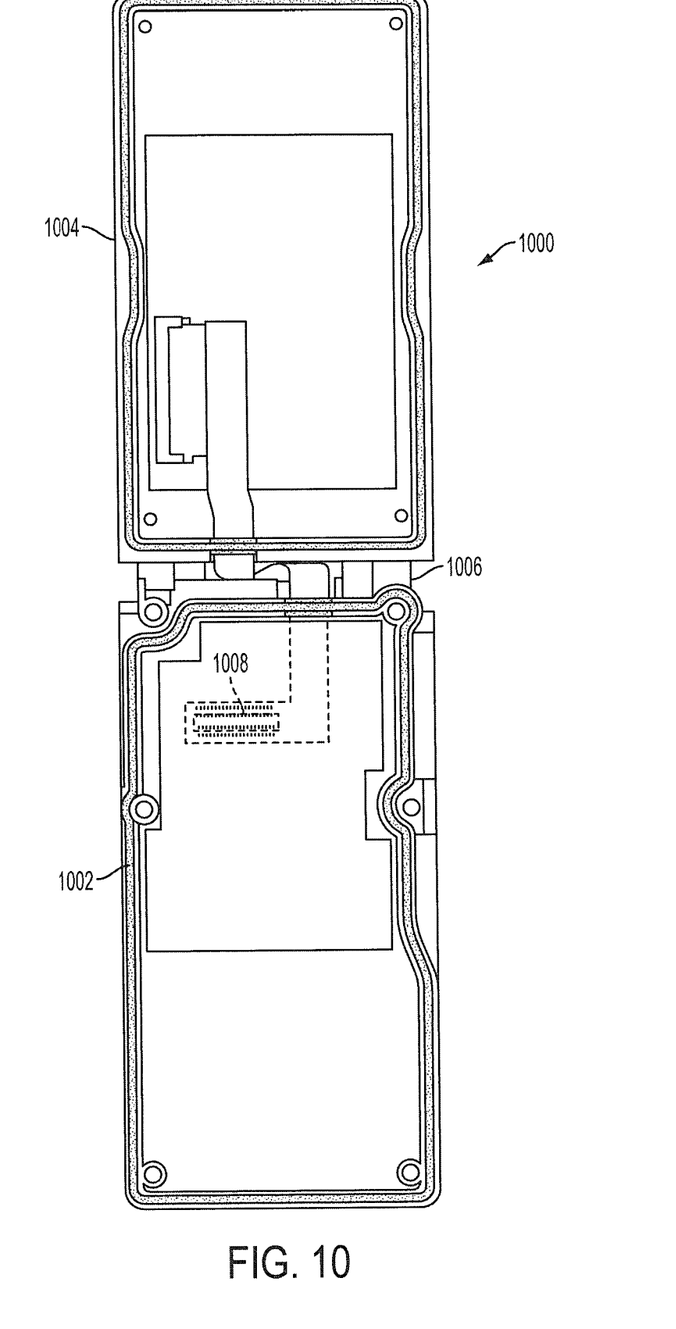
FIG. 10 is a cut-away view of a flip-type cell phone in which an embodiment of an FPC of the present invention is installed.

FIG. 10 illustrates a top cut-away view of a cell phone 1000. A keyboard unit 1002 may be mechanically connected to an display unit 1004 with a hinge 1006 to enable the two units 1002, 1004 to pivot relative to each other. The two units 1002, 1004 may be electrically coupled to each other with an embodiment of an FPC 1008 of the present invention to inhibit the migration of water or other liquid along the edges of the resin strips.

It should be understood, of course, that the foregoing relate to exemplary embodiments of the invention and that modifications may be made without departing from the spirit and scope of the invention as set forth in the following claims.

I claim:

1. A flexible printed circuit (FPC), comprising:
   a base plate with entirely one straight edge from one end to another end and
   a pair of resin strips disposed on a first surface and a second surface opposite to the first surface of the base plate, comprising:
      a first conductive trace embedded between the base plate and a first resin strip of the pair of resin strips and configured to electrically couple a first unit of an electronic device at a tail end of the resin strips with a second unit of the electronic device at an opposing end of the resin strips;
      a second conductive trace embedded between the base plate and a second resin strip of the pair of resin strips and configured to electrically couple the first unit of electronic device with the second unit of electronic device; and
      a first edge of the first resin strip having a first cutout overlap with the base plate on the first surface and a second edge of the second resin strip having a second cutout overlap the base plate on the second surface formed therein adjacent to the tail end.

2. The FPC of claim 1, further comprising a water-tight film overlaying the resin strips at the tail end.

3. The FPC of claim 1, wherein the cutouts have a notch shape.

4. The FPC of claim 3, wherein the cutouts are about 6 millimeters (mm) wide, about 6 mm deep, and spaced about 3 mm apart along each edge.

5. The FPC of claim 1, wherein the cutouts have an oblong shape with a narrow opening.

6. The FPC of claim 5, wherein the cutouts are about 3 mm wide, about 5 mm deep, and the openings are spaced about 5 mm apart along each edge.

7. The FPC of claim 1, wherein the cutouts comprise a pattern of cutouts having a notch shape alternating with cutouts having an oblong shape with a narrow opening.

8. A method of manufacturing a flexible printed circuit (FPC), comprising:
   providing a pair of resin strips having a tail end;
   embedding conductive traces between the resin strips configured to electrically couple a first unit of an electronic device at the tail end of the resin strips with a second unit of the electronic device at an opposing end of the resin strips;

forming cutouts in edges of the resin strips adjacent to the tail end configured to increase the effective length of the edges;

bonding a first resin strip of the pair of resin strips to a first surface of a baseplate, and a second resin strip of the pair of resin strips to a second surface opposite to the first surface of the baseplate, wherein the baseplate has entirely one straight edge from one end to another end, a first edge of the first resin strip has a first cutout overlap with the base plate on the first surface, and a second edge of the second resin strip has a second cutout overlap with the base plate on the second surface;

one of the conductive traces is embedded between the base plate and the first resin strip;

another of the conductive traces is embedded between the base plate and the second resin strip; and overlaying a water-tight film on the resin strips at the tail end.

9. The method of claim 8, wherein the cutouts have a notch shape.

10. The method of claim 9, wherein the cutouts are about 6 millimeters (mm) wide, about 6 mm deep, and spaced about 3 mm apart along each edge.

11. The method of claim 8, wherein the cutouts have an oblong shape with a narrow opening.

12. The method of claim 11, wherein the cutouts are about 3 mm wide, about 5 mm deep, and the openings are spaced about 5 mm apart along each edge.

13. The method of claim 8, wherein the cutouts comprise a pattern of cutouts having a notch shape alternating with cutouts having an oblong shape with a narrow opening.

14. An electronic device, comprising:
a first unit;
a second unit pivotally connected to the first unit; and
a flexible printed circuit (FPC) disposed to electrically couple the first unit with the second unit, comprising:
base plate with edges formed in a first shape;
a pair of resin strips, wherein a first resin strip of the pair of resin strips is disposed on a first surface of the baseplate, and a second resin strip of the pair of resin strips is disposed on a second surface opposite to the first surface of the baseplate;
a first conductive trace is embedded between the base plate and a first resin strip of the pair of resin strips and configured to electrically couple the first unit at a tail end of the pair of resin strips with the second unit at an opposing end of the pair of resin strips,
a second conductive trace is embedded between the base plate and a second resin strip of the pair of resin strips and configured to electrically couple the first unit with the second unit;
the pair of resin strips having edges with a second shape different from the first shape, a first edge of the first resin strip having a first cutout overlap with the base plate on the first surface and a second edge of the second resin strip having a second cutout overlap with the base plate on the second surface formed therein configured to increase the effective length of the edges; and
a water-tight film overlaying the resin strips at the tail end and further in touch with the base plate.

15. The electronic device of claim 14, wherein the cutouts have a notch shape.

16. The electronic device of claim 15, wherein the cutouts are about 6 millimeters (mm) wide, about 6 mm deep, and spaced about 3 mm apart along each edge.

17. The electronic device of claim 14, wherein the cutouts have an oblong shape with a narrow opening, wherein the cutouts are about 3 mm wide, about 5 mm deep, and the openings are spaced about 5 mm apart along each edge.

18. The electronic device of claim 14, wherein the cutouts comprise a pattern of cutouts having a notch shape alternating with cutouts having an oblong shape with a narrow opening.

19. The electronic device of claim 14, wherein the first unit is a keyboard unit and the second unit is a main computer system unit.

20. The electronic device of claim 14, wherein the first unit comprises a keyboard unit of a notebook computer and the second unit comprises a display unit of the notebook computer.

* * * * *